(12) United States Patent
Krauss

(10) Patent No.: US 8,946,885 B2
(45) Date of Patent: Feb. 3, 2015

(54) SEMICONDUCTOR ARRANGEMENT AND METHOD FOR PRODUCING A SEMICONDUCTOR ARRANGEMENT

(75) Inventor: Andreas Krauss, Tuebingen (DE)

(73) Assignee: Robert Bosch GmbH, Stuttgart (DE)

( * ) Notice: Subject to any disclaimer, the term of this patent is extended or adjusted under 35 U.S.C. 154(b) by 419 days.

(21) Appl. No.: 13/063,652

(22) PCT Filed: Jul. 13, 2009

(86) PCT No.: PCT/EP2009/058924
§ 371 (c)(1),
(2), (4) Date: Mar. 22, 2011

(87) PCT Pub. No.: WO2010/028880
PCT Pub. Date: Mar. 18, 2010

(65) Prior Publication Data
US 2011/0180810 A1    Jul. 28, 2011

(30) Foreign Application Priority Data
Sep. 12, 2008  (DE) .......................... 10 2008 042 035

(51) Int. Cl.
*H01L 23/00*     (2006.01)
*H01L 23/15*     (2006.01)
*H01L 23/492*    (2006.01)

(52) U.S. Cl.
CPC ............ *H01L 23/15* (2013.01); *H01L 23/4924* (2013.01); *H01L 2224/4847* (2013.01); *H01L 2224/73265* (2013.01); *H01L 2924/01322* (2013.01)
USPC ............ 257/703; 257/E21.505; 257/E23.009; 438/125

(58) Field of Classification Search
CPC ..... H01L 29/12; H01L 29/1608; H01L 23/12; H01L 23/14; H01L 23/15
USPC .......... 257/703, E21.505, E23.009, 103, 684, 257/E23.005, 706, 747, 748; 438/125
See application file for complete search history.

(56) References Cited

U.S. PATENT DOCUMENTS

| | | | |
|---|---|---|---|
| 5,880,491 A * | 3/1999 | Soref et al. .................... 257/190 |
| 6,559,068 B2 * | 5/2003 | Alok et al. .................... 438/770 |
| 6,871,396 B2 * | 3/2005 | Sugaya et al. ................. 29/860 |
| 6,897,489 B1 * | 5/2005 | Peng et al. ..................... 257/96 |
| 6,989,553 B2 * | 1/2006 | Yokogawa et al. ............. 257/77 |
| 2003/0113906 A1 | 6/2003 | Sangha et al. |

(Continued)

FOREIGN PATENT DOCUMENTS

| | | |
|---|---|---|
| DE | 1 984 638 | 5/1968 |
| DE | 198 46 638 | 4/2000 |
| DE | 102 47 409 | 4/2004 |
| EP | 0 217 176 | 4/1987 |
| EP | 0 468 382 | 1/1992 |

(Continued)

OTHER PUBLICATIONS

International Search Report corresponding to PCT Application No. PCT/EP2009/058924, mailed Nov. 16, 2009 (German and English language document) (7 pages).

*Primary Examiner* — Kenneth Parker
*Assistant Examiner* — John Lin
(74) *Attorney, Agent, or Firm* — Maginot, Moore & Beck LLP

(57) ABSTRACT

A semiconductor arrangement includes a ceramic mount and at least one semiconductor component fixed-to the ceramic mount. The ceramic mount includes a first section, and the first section is electrically conductive.

15 Claims, 1 Drawing Sheet

(56) References Cited

U.S. PATENT DOCUMENTS

2006/0113906 A1* 6/2006 Ogawa .................... 313/512
2007/0138487 A1* 6/2007 Watanabe et al. ............ 257/86

FOREIGN PATENT DOCUMENTS

| EP | 1 129 048 | 4/2000 |
| WO | 2008041813 | 4/2008 |

* cited by examiner

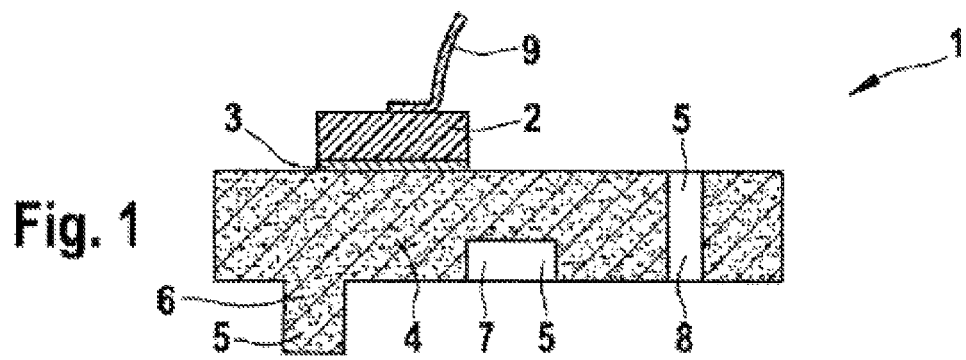
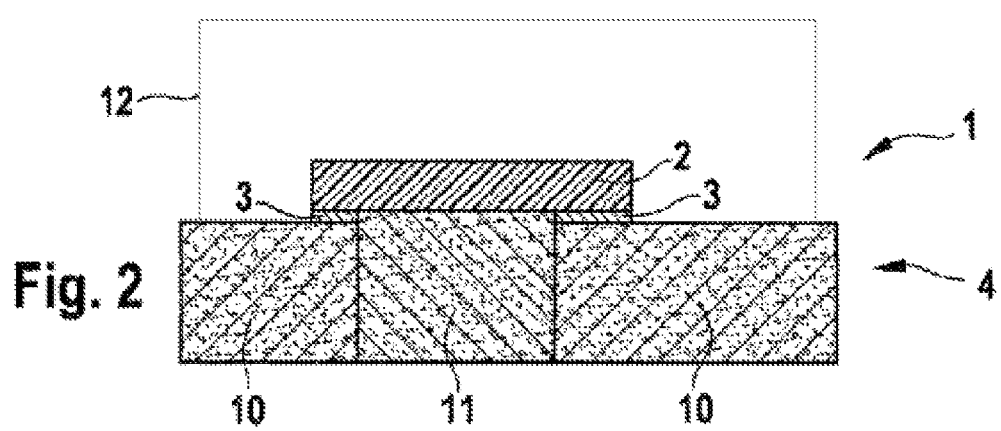
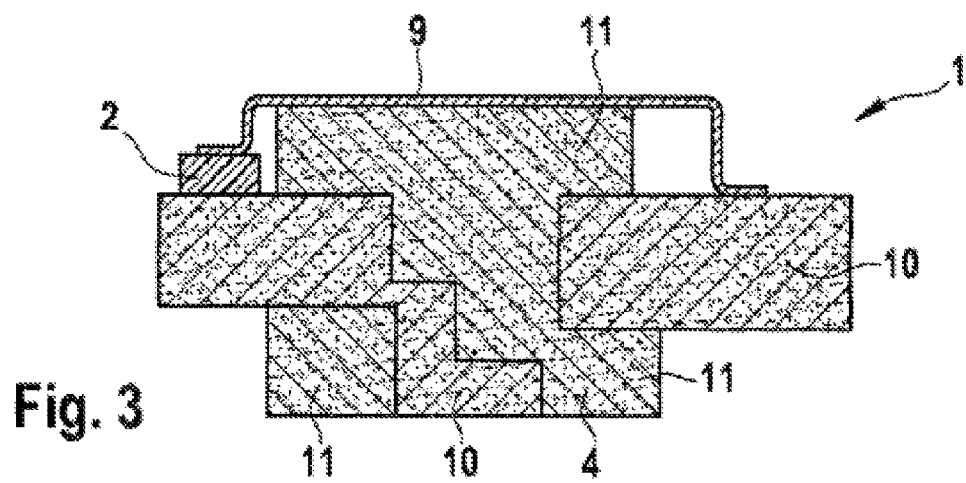

SEMICONDUCTOR ARRANGEMENT AND METHOD FOR PRODUCING A SEMICONDUCTOR ARRANGEMENT

This application is a 35 U.S.C. §371 National Stage Application of PCT/EP2009/058924, filed Jul. 13, 2009, which claims the benefit of priority to Ser. No. 10 2008 042 035.2, filed Sep. 12, 2008 in Germany, the disclosures of which are incorporated herein by reference in their entirety.

The disclosure relates to a semiconductor arrangement, to a use of a ceramic, and to a method for producing a semiconductor arrangement.

BACKGROUND

Ceramic housings or substrates, in which the ceramic is used as a mount for the semiconductor component and at the same time acts as electrical insulation, are currently used for encapsulation (packaging) of thermally highly loaded semiconductor components. The semiconductor component is in general mounted or soldered on the ceramic mount from its lower face, either by conductive or insulating adhesive. One such semiconductor arrangement is described in DE 10 2005 038 760 A1. In the semiconductor arrangement which is known from this document, the semiconductor component is fixed to the ceramic mount via a comparatively thick metal layer. Since the comparatively thick metal layer has a different coefficient of thermal expansion from the semiconductor material of the semiconductor component and the mount ceramic, mechanical stresses which destroy the semiconductor arrangement can occur, in particular if the semiconductor arrangement is subject to a severe temperature load.

In alternative, known semiconductor arrangements, housings composed of metal are used for semiconductor components, on which the semiconductor components are mounted electrically conductively by their lower face, with insulated connections being provided, for example via glass bushings.

Housings in which the semiconductor component is conductively adhesively bonded to a stamped metal mount, a so-called leadframe, have become standard for the encapsulation of power semiconductor components, such as transistors, with additional electrical connections being provided via further stamped contacts, and with the semiconductor component and the contacts being insert-molded with an insulating material, in general plastic or a plastic-based material.

All the known concepts reach their limits with respect to the maximum permissible temperatures, in particular when using so-called wide band gap semiconductor components. This is the case in particular at temperatures above 250° C., in particular when subject to the simultaneous influence of further environmental conditions, such as vibration or when used in a corrosive environment.

SUMMARY

The disclosure is based on the object of proposing a semiconductor arrangement concept which allows the use of the semiconductor arrangement at high temperatures. One particular aim is to avoid mechanical stresses resulting from large temperature differences. Furthermore, the object consists of proposing a method for producing a semiconductor arrangement such as this.

This object is achieved with regard to the semiconductor arrangement by the features set forth herein, by a use of a ceramic set forth herein and with regard to the method by the features set forth herein. Advantageous developments of the disclosure are specified herein. The scope of the disclosure covers all combinations of at least two features which are disclosed below and in the figures. In order to avoid repetition, features disclosed according to the method should be considered as having been disclosed as according to the apparatus. Likewise, features disclosed according to the apparatus should be considered to be disclosed as according to the method.

The disclosure is based on the idea of forming the mount for the semiconductor component, at least in places, from a ceramic which is electrically conductive, in particular metallically conductive, at least under temperature conditions in which it is used, as a result of which it is possible to provide the voltage and/or current supply for the semiconductor component directly via the ceramic mount, in particular without any need to use the comparatively thick metal layers required in the prior art, with a thickness extent of more than 30 µm. Dispensing with such thick metallic intermediate layers between the semiconductor part and the ceramic mount in turn leads to mechanical stresses resulting from different coefficients of thermal expansion being avoided, as a result of which the semiconductor arrangement designed on the basis of the concept of the disclosure is suitable for use at very high temperatures, in particular at temperatures of (well) above 250° C., preferably of above 400° C. Furthermore, a mount which is formed at least in places from electrically conductive ceramic material is distinguished by a very high thermal conductivity which ensures good heat dissipation and therefore further assists use at very high temperatures. In principle, the at least one semiconductor component may be in any desired form, for example a diode, transistor or integrated circuit (IC), etc. An embodiment is particularly preferable in which the semiconductor component is a so-called die which, for example, is fixed by soldering or other methods on the ceramic mount, which is electrically conductive at least in places. An embodiment of the semiconductor arrangement is preferred, in which electrically conductive ceramic mount forms at least one first contact, in particular a ground contact of the semiconductor component, in which case the connection technique or connection material for this purpose for the connection of the semiconductor component on the electrically conductive ceramic mount should likewise preferably be electrically conductive, and should preferably be only sufficiently thick that critical mechanical stresses resulting from different temperature coefficients are avoided. For example, it is thus possible to fix the semiconductor component to the ceramic mount by silver sintering, in which case the sintered layer can, for example, be applied to the semiconductor component by rear-face metallization with a very small thickness extent, immediately during the process of producing the semiconductor component.

A semiconductor arrangement designed on the basis of the concept of the disclosure is very particularly preferably suitable for use in a motor vehicle. For example, it is thus possible to use a semiconductor arrangement such as this, comprising, for example, at least one SiC power diode, in or on a generator of a motor vehicle generator, with the SiC power diodes being fitted directly, for example via a thin film, to the SiC ceramic elements which, because of their excellent mechanical characteristics, such as resistance to wear and temperature, can also carry out further functions with corresponding, optional function structure sections, which will be explained later.

A development of the disclosure advantageously provides for the semiconductor component to be composed of a so-called wide band gap semiconductor material, or to be formed from such a material. A wide band gap semiconductor material is a semiconductor material having a wide band gap of preferably more than 2 eV. The wide band gap semiconductor material, such as SiC, is distinguished by the capability to be operated at considerably higher temperatures than silicon.

An embodiment of the semiconductor arrangement is very particularly preferable in which the electrically conductive ceramic mount and the semiconductor component have at least approximately the same coefficient of thermal expansion, in order, preferably completely, to avoid the occurrence of temperature-dependent mechanical stresses. It is possible to achieve the same coefficient of thermal expansion in a simple manner if the electrically conductive ceramic mount and the semiconductor component are formed from the same basic material, preferably from wide band gap semiconductor material. In this case, it is possible to form the ceramic mount from the same material only in places, in which case, if the same material is chosen only in places, it is preferable that the semiconductor component and the ceramic mount be formed from the same material in the attachment area.

The electrically conductive ceramic mount, which may also be an intermediate mount, is particularly preferably a component of a housing which encapsulates the semiconductor component, or the ceramic mount forms the housing for the semiconductor component completely itself.

In one very simple embodiment, the ceramic mount is designed to be completely conductive and is used, for example, as a ground connection for the semiconductor component. In an alternative embodiment, the ceramic mount has at least one electrically conductive area and at least one electrically non-conductive area, in which case it is furthermore preferable for the electrically conductive area of the ceramic mount to make contact with the semiconductor component. The provision of at least one electrically conductive area and of at least one electrically non-conductive area can be achieved by an appropriate material choice, that is to say the provision of different ceramic materials in the different areas of the ceramic mount. A completely conductive mount is preferably composed of a homogeneous ceramic material. In the simplest case, the ceramic mount is in the form of a platelet or wafer.

If the electrically conductive and electrically non-conductive areas of the ceramic mount are configured suitably, a plurality of electrical connections can be provided via the ceramic mount itself. If required, further connections can be produced directly from contacts on the semiconductor component, for example via metallic connecting lines, which are used for direct connection of the semiconductor component and/or which lead to electrically insulating or electrically conductive areas of the ceramic mount. If required, the pressure and/or the heat which are/is created during connection of these lines, for example by means of a welding process, can be used for the formation, for example joining, curing, soldering, etc., of the connection between the semiconductor component and the ceramic mount.

There are various options for the configuration of the electrically conductive ceramic mount and for the arrangement of the electrically conductive and electrically non-conductive (insulating) areas of the ceramic mount. For example, in one very simple embodiment, electrically conductive and electrically non-conductive areas can be arranged alongside one another on a plane, that is to say preferably with a comparatively small thickness extent. In one alternative embodiment, electrically conductive and electrically non-conductive areas may be combined as a three-dimensional structure, which allows more complex line and insulation routing and arrangement.

As mentioned initially, a semiconductor arrangement designed on the basis of the concept of the disclosure makes it possible to dispense with thick adhesion promoter layers and intermediate layers between the semiconductor component and the ceramic mount. For example, it is now possible to fix the semiconductor component on the ceramic mount via at least one auxiliary layer which is in the form of a thin film (in particular an adhesion promoter layer), in which case a thin film means a layer with a thickness extent of less than 5 µm, particularly preferably of less than 2 µm, and very particularly preferably of less than 1 µm. This thin film may, for example, be produced by vapor deposition of at least one thin metal layer, in particular a titanium layer, in order to prepare the semiconductor component and/or the ceramic mount for the adhesion or soldering process. The thin film is very particularly preferably produced in the form of rear-face metallization of the semiconductor component, even while the semiconductor component is being produced. In this case, it is very particularly preferable for the thin film to be a layer which can be sintered.

In general, it can be stated that, if the semiconductor component and the ceramic mount are joined by soldering, this should be carried out at a temperature which is below the operating temperature of the semiconductor component. For example, the joining process can be carried out by brazing in a temperature range between 600° C. and 900° C. Alternatively, a connection can also be produced by eutectic bonding or an adhesion process, or a glazing or melting process, preferably at comparatively low temperatures.

One development of the disclosure advantageously provides for the ceramic mount to carry out at least one further function, in addition to the function of mounting and holding the semiconductor component. For this purpose, the ceramic mount preferably has a mechanical function structure section, for example in the form of an attachment section and/or a heat-sink section and/or a bearing section, for example to form a journal bearing, etc. The mechanical function structure section can in this case be formed either from electrically conductive or electrically non-conductive ceramic, in which case it is particularly preferable for the function structure section to be fiber-reinforced. It is also possible for the ceramic mount to be in the form of a composite component having at least one non-ceramic material, which preferably forms the function structure section, in order to allow even highly complex structural shapes to be produced reliably and such that they are protected against fracturing.

There are various options for the specific embodiment of the function structure section. For example, this may comprise at least one opening, for example for holding an attachment element, such as a screw, etc. It is also possible for the function structure section to be formed by at least one alignment tab and/or at least one latching tab. Additionally or alternatively, the function structure section may have a section in the form of a pin, in particular for fixing the ceramic mount to a further component.

The disclosure also leads to the use of a ceramic, which is electrically conductive at least in places and is known per se, in particular a so-called wide band gap ceramic, as a mount for a semiconductor component, with the surprising advantages described above.

Furthermore, the disclosure leads to a method for producing a semiconductor arrangement, which is very particularly preferably configured as described above. The essence of the method is to provide a ceramic mount which is electrically conductive at least in places and which, if required, may also be in the form of a composite component, comprising a non-ceramic section. The semiconductor component and the ceramic mount are preferably joined such that the semiconductor component makes contact with at least one electrically conductive section of the ceramic mount, such that the ceramic mount provides at least one electrical connection for the semiconductor component.

The semiconductor component material is preferably fixed to the ceramic mount with an auxiliary layer in the form of a thin film being provided, in which case a thin film can be provided having a thickness extent of less than 5 µm on the semiconductor component and/or on the ceramic material, for example by vapor deposition.

The auxiliary layer is very particularly preferably applied by rear-face coating, in particular rear-face metallization of the semiconductor component, preferably during its production process.

BRIEF DESCRIPTION OF THE DRAWINGS

Further advantages, features and details of the disclosure will become evident from the following description of one preferred exemplary embodiment and from the drawings, in which:

FIG. 1 shows a first exemplary embodiment of a semiconductor arrangement, in which the ceramic mount is formed completely from electrically conductive ceramic, FIG. 2 shows a semiconductor arrangement, comprising a ceramic mount which has two electrically conductive areas and one electrically insulating area, and FIG. 3 shows a semiconductor arrangement having a ceramic mount, which comprises three-dimensionally arranged electrically conductive and electrically non-conductive areas.

DETAILED DESCRIPTION

The same elements and elements having the same function are identified by the same reference symbols in the figures.

FIG. 1 shows a semiconductor arrangement 1 having a semiconductor component 2 which is in the form of a die and is fixed to a ceramic mount 4 via an auxiliary layer 3 (thin film) in the form of an adhesive layer. The auxiliary layer 3 is electrically conductive, in order to make a ground contact via the ceramic mount 4 with the semiconductor component 2. In the illustrated exemplary embodiment, the ceramic mount 4 is formed completely from electrically conductive ceramic material, in which case, in addition to the electrically conductive ceramic material, alternative embodiments may have electrically non-conductive ceramic material and non-ceramic material, for example to form the function structure sections which are still to be explained in the following text.

As mentioned, the electrically conductive, ceramic mount 4 has a total of three function structure sections 5 which, in the illustrated exemplary embodiment, are formed directly in the electrically conductive ceramic material. A first function structure section 5, on the left on the plane of the drawing, is a centering tab 6; a second function structure section 5, in the center on the plane of the drawing, is a cutout 7, and a third function structure section 5, on the right on the plane of the drawing, is a through-opening 8.

As can also be seen from FIG. 1, contact is made with the semiconductor component 2 not only via the ceramic mount 4 but via a further additionally electrical contact 9, which in this case is in the form of a wire-bonding contact and is fixed on the upper face of the semiconductor component 2 on the plane of the drawing.

In the illustrated exemplary embodiment as shown in FIG. 1, the semiconductor component 2 and the ceramic mount 4 are formed from the same wide band gap semiconductor ceramic material, in this case SiC.

The exemplary embodiment shown in FIG. 2 differs from the previously described exemplary embodiment as shown in FIG. 1 essentially in that the ceramic mount 4 is formed from different ceramic materials and has two (outer) electrically conductive areas 10 and one electrically non-conductive area 11 (insulator) held like a sandwich between them. The electrically conductive and non-conductive areas 10, 11 are arranged alongside one another on a substantially two-dimensional plane. It should be noted that the semiconductor component 2 is arranged such that it makes contact with the two electrically conductive areas 10 on the mount 4, by means of two contact areas which are separate from one another. For this purpose, the semiconductor component 2 is connected to the electrically conductive areas 10 via a respective auxiliary layer 3 (thin film), which is in the form of a sintered layer. FIG. 2 also depicts the ceramic mount 4 as a component of a housing 12 which encapsulates the semiconductor component 2 on the ceramic mount 4.

The exemplary embodiment illustrated in FIG. 3 shows a further alternative embodiment of a semiconductor arrangement 1, comprising a semiconductor component 2 and a ceramic mount 4 of complex design, in which electrically conductive and electrically non-conductive areas 10, 11 are provided in a three-dimensional structure arrangement, with the semiconductor component 2 being electrically conductively directly connected to the electrically conductive area 10 of the ceramic mount 4 via a solder layer (not shown), which is provided between two thin films and is likewise in the form of a thin film, with an electrically conductive connection being made between the upper face of the semiconductor component 2 and a further electrically conductive area 10 on the ceramic mount 4 via a further electrical contact 9, which is in the form of a wire connection, and with the further electrically conductive area 10 being isolated by an electrically non-conductive area 11 from the electrically conductive area 10 which is shown on the left on the plane of the drawing and to which the semiconductor component 2 is fitted.

The invention claimed is:

1. A semiconductor arrangement, comprising:
   a ceramic mount; and
   at least one semiconductor component fixed to a first side of the ceramic mount,
   wherein the ceramic mount includes
   at least one electrically conductive area formed of an electrically conductive ceramic material,
   wherein the ceramic mount includes at least one electrically non-conductive area formed of an electrically non-conductive ceramic material, and
   wherein the at least one electrically conductive area and the at least one electrically non-conductive area are arranged alongside one another in relation to the first side.

2. The semiconductor arrangement as claimed in claim 1, wherein the at least one semiconductor component is composed of a semiconductor material that includes SiC.

3. The semiconductor arrangement as claimed in claim 1, wherein the ceramic mount and the at least one semiconductor component have at least approximately the same coefficient of thermal expansion.

4. The semiconductor arrangement as claimed in claim 1, wherein:
   at least the first section of the ceramic mount and the at least one semiconductor component are formed from the same ceramic material.

5. The semiconductor arrangement as claimed in claim 1, further comprising at least one interconnect connected between the at least one semiconductor component and the ceramic mount, wherein the electrically non-conductive area is arranged to support the at least one interconnect.

6. The semiconductor arrangement as claimed in claim 1, wherein the electrically conductive area and the electrically non-conductive area are arranged alongside one another on a substantially two-dimensional plane or in a three-dimensional structure.

7. The semiconductor arrangement as claimed in claim 1, wherein the semiconductor component is connected to the ceramic mount by silver sintering.

8. The semiconductor arrangement as claimed in claim 7, wherein:
the semiconductor component is connected to the ceramic mount by silver sintering with the involvement of at least one metallic auxiliary layer, and
the auxiliary layer is applied to the at least one semiconductor component by rear-face coating.

9. The semiconductor arrangement as claimed in claim 7, wherein the at least one semiconductor component is connected to the ceramic mount by silver sintering which forms a metallic auxiliary layer between the semiconductor component and the ceramic mount, the auxiliary layer being in the form of a thin film with a thickness of less than 5 μm.

10. The semiconductor arrangement as claimed in claim 1, wherein:
the ceramic mount has a mechanical function structure section, and
the mechanical function structure section includes one of an attachment section, a heat-sink section, and a bearing section.

11. The semiconductor arrangement as claimed in claim 1, wherein:
the ceramic mount has a mechanical function structure section, and
the mechanical function structure section comprises an opening for holding an attachment element, and/or an alignment tab, and/or a latching tab, and/or an attachment pin.

12. The semiconductor arrangement as claimed in claim 1, wherein:
the at least one semiconductor component has a band gap, and
the band gap is greater than 2 eV.

13. The semiconductor arrangement as claimed in claim 1, wherein the ceramic mount includes two electrically conductive areas formed of electrically conductive ceramic material, and
wherein the two electrically conductive areas and the at least one electrically non-conductive are arranged alongside each other in relation to the first side with the two electrically conductive areas being separated by the at least one electrically non-conductive area.

14. The semiconductor arrangement as claimed in claim 13, wherein the semiconductor component is electrically connected to the two electrically conductive areas.

15. The semiconductor arrangement as claimed in claim 13, wherein the two electrically conductive areas are isolated from each other by the at least one non-electrically conductive area.

* * * * *